(12) United States Patent
Cariello

(10) Patent No.: US 11,763,861 B2
(45) Date of Patent: *Sep. 19, 2023

(54) REDUCED PIN STATUS REGISTER

(71) Applicant: Micron Technology, Inc., Boise, ID (US)

(72) Inventor: Giuseppe Cariello, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/864,035

(22) Filed: Jul. 13, 2022

(65) Prior Publication Data

US 2023/0005512 A1   Jan. 5, 2023

Related U.S. Application Data

(63) Continuation of application No. 17/155,070, filed on Jan. 21, 2021, now Pat. No. 11,404,095.

(51) Int. Cl.
*G11C 7/10* (2006.01)
*G11C 7/12* (2006.01)

(52) U.S. Cl.
CPC .......... *G11C 7/109* (2013.01); *G11C 7/1048* (2013.01); *G11C 7/1063* (2013.01); *G11C 7/12* (2013.01)

(58) Field of Classification Search
CPC ..... G11C 7/109; G11C 7/1048; G11C 7/1063; G11C 7/12
USPC ...................................... 365/189.011, 230.06
See application file for complete search history.

(56) References Cited

U.S. PATENT DOCUMENTS

| 8,762,654 | B1 | 6/2014 | Yang et al. | |
| 9,093,132 | B2* | 7/2015 | Kim | G11C 7/1063 |
| 9,286,208 | B2* | 3/2016 | Ide | G06F 12/0246 |
| 9,940,030 | B2* | 4/2018 | Park | G11C 11/5642 |

(Continued)

FOREIGN PATENT DOCUMENTS

| CN | 108417233 A | 8/2018 |
| CN | 109597569 A | 4/2019 |

(Continued)

OTHER PUBLICATIONS

Chinese Patent Office, "Office Action", issued in connection with Chinese Patent Application No. 202210066451.X dated Jan. 18, 2023 (24 pages) (8 pages Original and 16 pages English Translation.

*Primary Examiner* — Michael T Tran
(74) *Attorney, Agent, or Firm* — Holland & Hart LLP

(57) ABSTRACT

Methods, systems, and devices for reduced pin status register are described. An apparatus may include a first memory die and a second memory die each coupled with a data bus. The apparatus may further include a controller coupled with the first memory die and the second memory die via the data bus that is configured to transmit a first command associated with a first operation to the first memory die and a second command associated with a second operation to the second memory die. The controller may further transmit a third command concurrently to the first memory die and the second memory die, the third command requesting a first status of the first operation and a second status of the second operation. The controller may receive the first status and the second status concurrently via the data bus from the first memory die and the second memory die.

20 Claims, 8 Drawing Sheets

(56) References Cited

U.S. PATENT DOCUMENTS

| | | |
|---|---|---|
| 11,107,512 B2 * | 8/2021 | Jeong .................... G11C 16/26 |
| 11,322,483 B1 * | 5/2022 | Ogawa ................... H01L 25/50 |
| 11,348,901 B1 * | 5/2022 | Hou ........................ H01L 24/32 |
| 11,404,095 B1 * | 8/2022 | Cariello .................. G11C 7/12 |
| 2014/0379963 A1 | 12/2014 | Kazama |
| 2018/0210847 A1 | 7/2018 | Walker |
| 2018/0226108 A1 | 8/2018 | Kwon |
| 2018/0307597 A1 | 10/2018 | Oh et al. |
| 2019/0087129 A1 | 3/2019 | You |
| 2019/0102330 A1 | 4/2019 | Hasbun et al. |
| 2021/0082524 A1 | 3/2021 | Akamine et al. |
| 2021/0105161 A1 | 4/2021 | Hasbun et al. |
| 2021/0389878 A1 * | 12/2021 | Lindberg .............. G06F 3/0611 |
| 2022/0011959 A1 * | 1/2022 | Srinivasan .......... G06F 13/1668 |
| 2022/0028879 A1 * | 1/2022 | Mochizuki ............. H10B 43/27 |
| 2022/0052073 A1 * | 2/2022 | Kitazawa .......... H01L 29/40114 |
| 2022/0091775 A1 * | 3/2022 | Shridhar .............. G06F 3/0655 |
| 2022/0093555 A1 * | 3/2022 | Hou ........................ H01L 24/05 |
| 2022/0102375 A1 * | 3/2022 | Kubo .................... H10B 41/35 |
| 2022/0189984 A1 * | 6/2022 | Oki ..................... H01L 23/5226 |
| 2022/0206719 A1 * | 6/2022 | Juan ..................... G06F 3/0659 |
| 2022/0208748 A1 * | 6/2022 | Rabkin ................. H10B 43/27 |
| 2022/0230664 A1 * | 7/2022 | Cariello ............... G11C 7/1048 |
| 2023/0046535 A1 * | 2/2023 | Cariello ............... G06F 3/0658 |
| 2023/0114146 A1 * | 4/2023 | Desai ................... G06F 3/0659 |
| | | 711/154 |

FOREIGN PATENT DOCUMENTS

| | | |
|---|---|---|
| CN | 109599141 A | 4/2019 |
| CN | 112231253 A | 1/2021 |

* cited by examiner

REDUCED PIN STATUS REGISTER

CROSS REFERENCE

The present Application for Patent is a continuation of U.S. patent application Ser. No. 17/155,070, now U.S. Pat. No. 11,404,095, by Cariello et al., entitled "REDUCED PIN STATUS REGISTER," filed Jan. 21, 2021, assigned to the assignee hereof, and expressly incorporated by reference herein.

FIELD OF TECHNOLOGY

The following relates generally to one or more systems for memory and more specifically to reduced pin status register.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
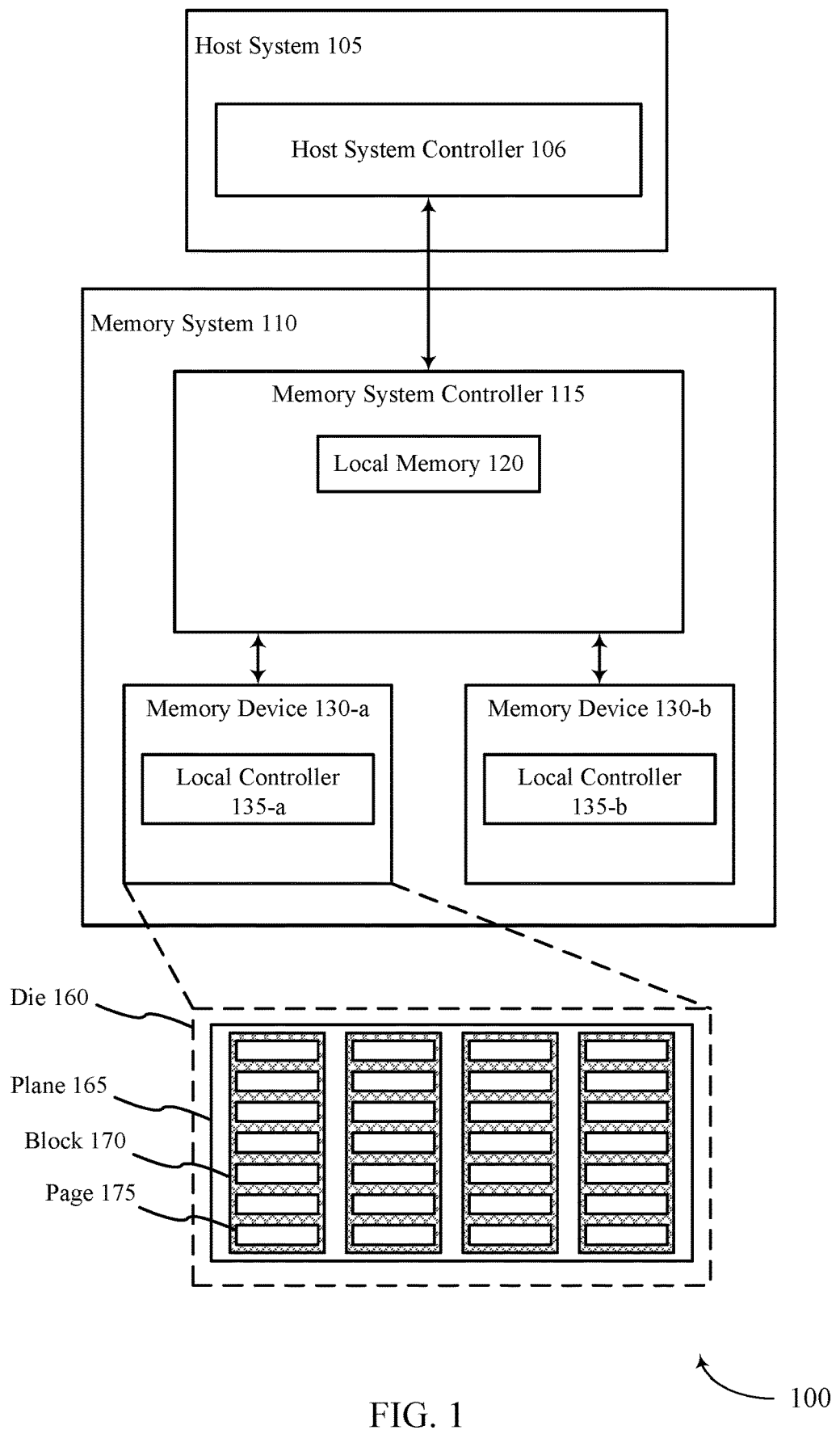
FIG. 1 illustrates an example of a system that supports reduced pin status register in accordance with examples as disclosed herein.

A system may include a host system and a memory system that stores data for the host system. In some examples, the memory system may include multiple memory devices attached to an interface. For example, the memory system may include multiple NAND devices attached to the same interface (e.g., Open NAND Flash Interface (ONFI) channel). The host system may transmit access commands (e.g., read commands, program commands, erase commands) to the memory system. In such examples, the memory system may execute operations in response to the commands received from the host system. In examples where multiple memory devices are included in the memory system, the memory devices may perform concurrent operations—e.g., operations that may not be initiated at the same time but proceed in parallel. That is, the memory system may initiate a first operation at a first memory device, then a second operation at a second memory device, then a third operation at a third memory device, and the first, second, and third operations may be executed at least partially in parallel. In some examples, the host system controller or memory system controller may execute round robin polling of the status register of each active memory device to determine if a given memory device is ready to be serviced—e.g., the controller may poll the first memory device, then the second memory device, and then the third memory device, to determine if the first, second, or third memory device is ready to be serviced. In some examples, performing round robin polling may increase latency and power consumption in the system. For example, the second memory device may be ready to be serviced before the first memory device but may wait idly until the system is done polling the status register of the first memory device. Also switching from one memory device to another memory device to poll the memory devices in the round robin polling may utilize additional power consumption for the bus transitions. And finally, a memory device idly waiting for a subsequent command may increase power consumption as well.

Systems, techniques, and devices are described herein to perform concurrent or parallel status polling via a dedicated command in a memory system with multiple memory devices. That is, a controller in the memory system may transmit a command concurrently to multiple memory devices and the memory devices may concurrently multiplex their status via a data bus coupling the controller and the memory devices. Each memory device may be configured to output its status on one or more lines of the data bus. For example, for an eight (8) bit data bus, four memory devices may each multiplex their status using two lines of the data bus—e.g., each memory device may be configured to perform two (2) operations in parallel and may output a status of each operation. In other examples, the memory system may include eight (8) memory devices that may each multiplex their status using one (1) line of the data bus. In some examples, the memory devices may be permanently configured to output their status on a given data bus line—e.g., by using trim settings that are written during manufacturing. In other examples, the memory system may dynamically select which data line a given memory device may utilize while outputting the status—e.g., by using registers. In such examples, the memory system may be configured to adapt based on the contingent workload—e.g., if more than eight (8) devices are attached to the same data bus, it may be more convenient to reconfigure which data bus each memory devise utilizes during a given operation and/or workload. By performing concurrent parallel status polling, the memory system may decrease power consumption and latency. That is, the memory system may be configured to identify which memory devices are ready to be serviced first and transmit subsequent commands to the given memory devices. This may reduce a quantity of time the memory device waits idly for the subsequent command, reducing power consumption and latency of the system.

Features of the disclosure are initially described in the context of systems, devices, and circuits as described with reference to FIG. 1. Features of the disclosure are described in the context systems, timing diagrams, and circuits as described with reference to FIGS. 2-4. These and other features of the disclosure are further illustrated by and described with reference to an apparatus diagram and flowcharts that relate to reduced pin status register as described with reference to FIGS. 5-8.

FIG. 1 illustrates an example of a system 100 that supports reduced pin status register in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support reduced pin status register. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some examples, memory system controller 115 may perform polling operations on the memory devices 130 to determine a status of the operations being performed by each memory device 130. In some cases, the memory system controller 115 may conduct the polling operation in a round robin system. For example, the memory system controller 115 may first request a status of a first operation being executed at the memory device 130-a and then request a status of a second operation being executed at the memory device 130-b. In some cases, the second operation may be executed before the first operation. In such examples, the memory device 130-b may idly wait for the memory system controller 115 to request the status of the second operation. The idle wait period may increase the power consumption and latency of the system.

As described herein, the memory system controller 115 may perform a concurrent polling operation on the memory devices 130. For example, the memory system controller may transmit a concurrent polling command to each memory device 130. The memory devices 130 may then drive a status signal on a given data line over a data bus coupling the memory devices 130 and memory system controller 115. When either memory device 130 is complete with their operation, the given memory device 130 may transition the bit from a busy state to a ready to be serviced state. The memory system controller 115 may then proceed to service the memory device 130. By performing the concurrent polling operation, the memory system controller 115 may service the first memory device 130 available, reducing the idle time and decreasing the latency and power consumption of the system.

Figure 2:
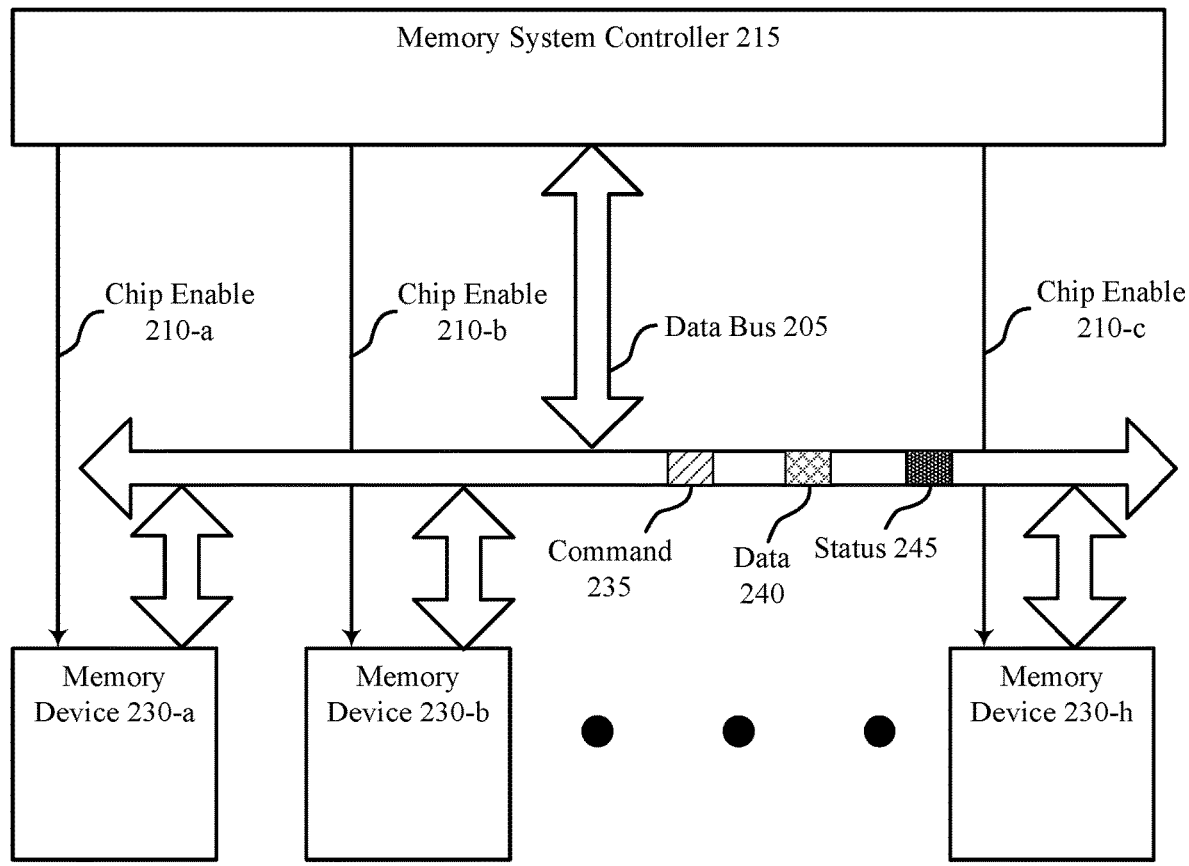
FIG. 2 illustrates an example of a system that supports reduced pin status register in accordance with examples as disclosed herein.

FIG. 2 illustrates an example of a system 200 that supports reduced pin status register in accordance with examples as disclosed herein. System 200 may be an example of a memory system 110 as described with reference to FIG. 1. System 200 may include a memory system controller 215 and memory devices 230 which may be examples of memory system controller 115 and memory devices 130 as described with reference to FIG. 1. The memory system controller 215 may be coupled with the memory devices 230 via a data bus 205. The memory system controller 215 may also be coupled with each memory device 230 via a chip enable line 210—e.g., memory device 230-a may be coupled with the memory system controller 215 via chip enable line 210-a. In some examples, there may be eight (8) memory devices 230 coupled with memory system controller 215. In other examples, there may be more than or less than eight (8) memory devices 230 coupled with the memory system controller 215. It should be noted, a quantity of memory devices 230 in the system 200 are not limiting on the claims.

As described with reference to FIG. 1, memory system controller 215 may be configured to communicate commands from a host system (e.g., host system 105) to memory devices 230. In some examples, the memory system controller 215 may be configured to transmit a command 235 to the memory devices 230 via the data bus 205. In such examples, the memory system controller 215 may be configured to activate a memory device 230-a via a chip enable line 210 to transmit the command 235 from the memory system controller 215 to a given memory device 230. For example, the memory system controller 215 may activate memory device 230-a via chip enable line 210-a and then transmit a command 235 to initiate an operation to the memory device 230-a. In some examples, the memory system controller 215 may be configured to transmit commands 235 to initiate concurrent operations—e.g., operations that may not be initiated at the same time but proceed in parallel. For example, the memory system controller 215 may be configured to activate memory device 230-a by transmitting a chip enable signal via the chip enable line 210-a. The memory system controller 215 may then transmit a command 235 to the memory device 230-a to initiate a first operation. The memory system controller 215 may then activate memory device 230-b via the chip enable line 210-b and transmit a second command 235 to the memory device 230-b to initiate a second operation. In such examples, the first operation and the second operations may be performed concurrently (e.g., in parallel) by the memory device 230-a and the memory device 230-b.

In some examples, the memory system controller 215 may be configured to communicate data 240 to and from the memory devices 230. For example, the memory system controller 215 may transmit data 240 to the memory devices 230 during a program command and receive data 240 from the memory devices 230 during a read command. The memory system controller 215 may also be configured to receive a status 245 from each memory device 230—e.g., the status 245 may indicate the status of a given operation being performed at a given memory device 230 and whether the given memory device 230 is ready to be serviced.

Data bus 205 may be configured to communicate signals, commands 235, data 240, and statuses 245 between the memory system controller 215 and the memory devices 230—e.g., the data bus 205 may be a multiplexed (e.g., tri-state, bi-directional) bus configured to communicate both addresses and data 240. In some examples, the data bus 205 may be configured to have a quantity of bits equal to a quantity of data input/output (DQ) pins of the memory system controller 215. For example, the data bus 205 may be an eight (8) bit data bus 205 when the memory system controller 215 has eight (8) DQ pins. In some examples, the data bus 205 may also include a quantity of lines equal to the quantity of bits—e.g., each line of the data bus 205 may be configured to communicate a bit of information. In some examples, the data bus 205 may also communicate a status 245 of each memory device 230 performing an operation concurrently. That is, the data bus 205 may be configured to multiplex the statuses 245 from the memory devices 230 to the memory system controller 215—e.g., a first status 245 from memory device 230-a may be communicated on a first line of the data bus 205 to the memory system controller 215 and a second status 245 from memory device 230-h may be concurrently communicated on a second line of the data bus 205 to the memory system controller 215.

Memory devices 230 may be configured to store data. In some examples, the memory devices 230 may be configured to receive commands 235 from the memory system controller 215. The memory devices 230 may be configured to concurrently perform operations in response to commands received from the memory system controller 215. Each memory device 230 may be configured to communicate data 240 to and from the memory system controller 215. In some examples, the memory devices 230 may also be configured to communicate a status 245 of an operation to the memory system controller 215. The status 245 may be a single bit indicating whether the memory device 230 is ready to be serviced—e.g., a status 245 of a given operation being performed at memory device 230. The memory devices 230 may be configured to access the data bus 205 based on the chip enable signal received from the memory system controller 215. For example, the memory device 230 may refrain from driving a status 245 or refrain from receiving a command 235 from the data bus 205 when the chip enable signal is in an inactivated (e.g., high) state. Alternatively, the memory device 230 may drive a status 245 or receive a command 235 from the data bus when the chip enable signal is in an activated (e.g., low) state—e.g., the memory system controller 215 may decouple the memory device 230 from the data bus 205 by driving the chip enable signal high. In some examples, each memory device 230 may include multiple independent sections (e.g., banks, partitions, planes). That is, each memory device 230 may be configured to perform two or more concurrent operations based on a first section being independent from a second section—e.g., a first plane may operate independently of a second plane in the memory device 230.

In some examples, the memory system controller 215 may receive a command from the host system. The memory system controller 215 may then activate a memory device 230 based on the command received from the host system—e.g., the memory system controller 215 may activate memory device 230-a, memory device 230-b, or memory device 230-h (e.g., via chip enable lines 210-a, 210-b, and 210-c respectively) based on the command received. After activating a memory device 230, the memory system controller 215 may transmit a command 235 to initiate an operation (e.g., a read, program, or erase operation) at the memory device 230. For example, the memory system controller may transmit a first command 235 to initiate an erase operation at memory device 230-a, a second command 235 to initiate a program operation at memory device 230-b, and a third command 235 to initiate a read operation at memory device 230-h. The memory system controller 215 may transmit the commands 235 sequentially (e.g., to memory device 230-a first and memory device 230-h last) while the operations may be performed concurrently at least in part. After each operation is initiated, the memory system controller 215 may perform a poll to determine a status of each operation and determine if the memory devices 230 are ready to be serviced.

In some examples, the memory system controller 215 may perform a round robin polling of a status register of each active memory device 230—e.g., each memory device 230 performing an operation. For example, the memory system controller 215 may deactivate the chip enable lines 210-b and 210-c to disconnect the data bus 205 from memory device 230-b and memory device 230-c while maintaining the chip enable line 210-a in an activated state. The memory system controller 215 may then transmit a command 235 to memory device 230-a to request a status 245 of the operation being performed at the memory device 230-a. The memory device 230-a may then transmit a status 245 utilizing the eight bits of data bus 205 to the memory system controller 215. The memory system controller 215 may then repeat the process to determine the status of the operations at memory devices 230-b and 230-h. In some examples, the memory device 230-h may complete its respective operation first. For example, the memory device 230-h may complete the read operation before the memory device 230-a completes the erase operation. That is, some operations may take a longer duration to perform than others—e.g., read operations may be performed in a first duration, program operations may be performed in a second duration, and erase operations may be performed in third duration, where the first duration is less than the second and third duration, and the second duration is less than the third duration. In such examples, the memory device 230-h may sit idly waiting for the memory system controller 215 to request the status 245 of the operation. This may increase the latency and power consumption of the system.

As described herein, the memory system controller 215 may perform a concurrent polling of the status register of each active memory device 230. For example, after initiating each operation at each memory device 230, the memory system controller 215 may concurrently transmit a command 235 to each of memory devices 230-a, 230-b, and 230-h (e.g., by activating each of chip enable lines 210-a, 210-b, and 210-h while transmitting the command) requesting the status of each operation. The memory devices 230 may then concurrently drive a status 245 on the data bus 205. In such examples, the memory devices 230 may drive a first value to indicate the memory device 230 is busy and a second value to indicate the memory device 230 is ready to be serviced. Accordingly, the memory system controller 215 may determine which memory device 230 is ready to be serviced first and transmit subsequent commands 235 based on the determination. For example, the memory device 230-h may drive the second value on the data bus 205 to indicate the memory device 230-h is ready for service. The memory system controller 215 may then request the data 240 indicated by the read command from the memory device 230-h while the memory device 230-a and memory device 230-b may continue to execute their respective operations. By performing concurrent poling, the memory system controller 215 may reduce latency and decrease extraneous power consumption.

Figure 3:
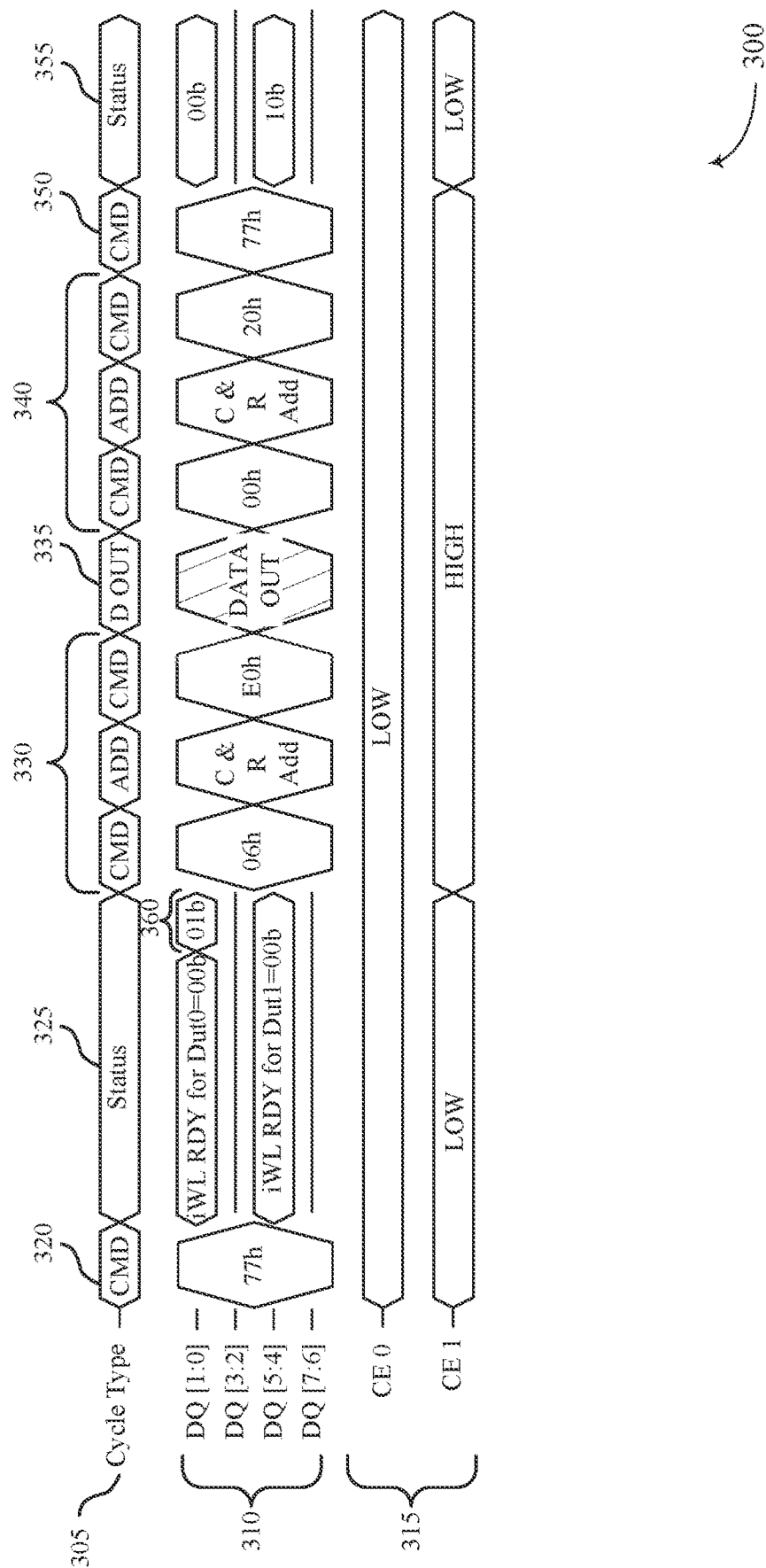
FIG. 3 illustrates an example of a timing diagram that supports reduced pin status register in accordance with examples as disclosed herein.

FIG. 3 illustrates an example of a timing diagram 300 that supports reduced pin status register in accordance with examples as disclosed herein. The timing diagram 300 may be performed by processing logic that may include hardware (e.g., processing system, circuitry, dedicated logic, programmable logic, microcode, hardware of a device, integrated circuit, etc.), software (e.g., instructions run or executed on a processing device), or a combination thereof. In some examples, the timing diagram 300 may be performed by a system (e.g., system 200) as described with reference to FIG. 2. For example, the timing diagram may be performed by a memory system controller (e.g., memory system controller 215 as described with reference to FIG. 2) and memory devices (e.g., memory devices 230 as described with reference to FIG. 2). In some examples, the memory system controller may execute a set of codes to control the functional elements of the memory system to perform the functions described below. Although shown in a particular sequence or order, unless otherwise specified, the order of the processes may be modified. Thus, the illustrated examples are used as examples, and the illustrated processes may be performed in a different order, and some processes may be performed in parallel. FIG. 3 may illustrate the system 100 communicating signals and commands (e.g., command 235, data 240, and status 245 as described with reference to FIG. 2) between a memory system controller and a memory device while conducting a concurrent polling operation.

In some examples, cycle type 305 may indicate the current cycle of the memory system controller or memory device—e.g., the type of signal communicated between the memory system controller and one or more memory devices via a data bus (e.g., data bus 205 as described with reference to FIG. 2). DQ pins 310 may be examples of data lines on the data bus and a quantity of DQ pins on the memory system controller. In examples where the data bus is an eight (8) bit data bus, the data bus may include eight (8) data lines—e.g., data lines 0-7. In some examples, a memory device may permanently output a status on a given data bus line—e.g., during manufacturing, a trim setting (e.g., fuse, one-time-programmable (OTP) memory) may be written to the memory device to cause the memory device to use a given data line for every status output. In examples where the memory device includes independent sections, the memory device may have two or more dedicated data lines—e.g., memory device 230-a may be configured to output a first status associated with a first independent section on data line 0 (e.g., DQ0) and a second status associated with a second independent section on data line 1 (e.g., DQ1). In other examples, the memory system controller may dynamically select which data line a given memory device is to utilize while outputting the status. In some examples, the memory system controller may select a data line based on a workload and quantity of devices. For example, the memory system may include more than eight (8) devices and the memory system controller may select data lines 0-7 for the eight (8) devices activated during a given duration. Alternatively, the memory system may include four (4) devices each with two (2) independent sections (e.g., banks, partitions, planes) and the memory system may select which data line each independent section status is to be outputted on. In yet other examples, the memory system may select some combination of devices with one (1) or two (2) sections each, or may combine status for multiple sections (e.g., one status bit that is driven to a ready state when all of multiple sections have completed a command). The memory system controller may select the data line for a given memory device by writing a value to a register on the memory device. In such examples, the memory device may read the value to determine which data line(s) the memory system controller assigned the memory device to.

In some cases, CE 315 may indicate a chip enable signal transmitted to a given memory device by a memory system controller via a chip enable line (e.g., chip enable line 210 as described with reference to FIG. 2). For example, CE 0 may indicate a chip enable signal driven to a first memory device and CE 1 may indicate a chip enable signal driven to a second memory device. As described with reference to FIG. 2, the CE signals may be active-low polarity. That is, a chip enable signal on chip enable line 210 driven low may enable the memory device (e.g., coupling the data bus for commands, data input or output, or status output) and a chip enable signal driven high may disable the memory device (e.g., the memory device may decouple inputs and drivers from the data bus). Alternatively, the CE signals may operate in a similar way using active-high polarity.

At 320, a first command may be transmitted. For example, a memory system controller may transmit a command "77h" to a first memory device and a second memory device via a data bus. The memory system controller may transmit the command "77h" to request a concurrent status output from a first memory device and a second memory device. For example, the memory system controller may request the status of an operation being performed at the first memory device and the second memory device—e.g., the memory system controller may request the memory device indicate whether the memory device is ready to be serviced. The memory system controller may have initiated an operation at the first memory device and the second memory device before transmitting the command "77h." In the example as described herein, each memory device may include two independent sections and each may perform two independent concurrent operations.

At 325, a status of the devices under test (Dut) may be received. For example, a memory system controller may receive a status from each memory device. In some examples, memory system controller may select data lines 0 and 1 for a first memory device to output a first status and a second status and select data lines 4 and 5 for a second memory device to output a third status and a fourth status—e.g., a status associated with each independent section and operation. In other examples, the first memory device and second memory device may have been programmed during manufacturing to output on data lines 0 and 1 and data lines 4 and 5 respectively. The first memory device may transmit "00b," which may indicate that both the first section and the second section (e.g., first independent bank, partition, plane, or word line and second independent bank, partition, plane, or word line) of the first memory device are busy. The second memory device may also concurrently transmit "00b" indicating that the first section and the second section of the second memory device is busy. Each memory device may continue to drive the signal "00b" until a section or device has completed an operation and is ready to be serviced. For example, the first memory device may drive the signal "00b" on data line 0 and 1 until the second section in the first memory device has completed the operation and is ready for service. In such examples, the first memory device may then begin to drive a signal "01b" at time 260 indicating the second section is ready to be serviced.

At 330, a second command may be transmitted. For example, the memory system controller may transmit the second command to the first memory device based on the first memory device indicating the second section is ready to be serviced. Concurrently with transmitting the second command, the memory system controller may also drive the chip enable signal for the second memory device high—e.g., CE 1 may transition to a high state via a chip enable line. By driving the chip enable signal high for the second memory device, the memory system controller may decouple the second memory device from the data bus—e.g., the second memory device may suppress driving status information and continue to execute an operation while the memory system controller transmits a command to the first memory device. In some examples, the memory system may transmit the second command to request data from the first memory device associated with the completed operation. The second command transmitted may indicate a type of command (e.g., read command indicated by "06h"), a column and row address (e.g., C & R Add), and additional information pertinent to the second command (e.g., "E0h"). For example, the memory system controller may indicate the read command is a single plane read, a multi-plane read, a single page read, a multi-page read, or a cache read after transmitting the second command (e.g., by transmitting "E0h").

At 335, data may be received. For example, the memory system controller may receive data from the first memory device in response to transmitting the second command. In examples where the operation performed by the first memory device was a program operation, at step 335 the memory system controller may transmit data to the first memory device. In other examples, when the first memory device performs an erase operation, at step 335 the first memory device may transmit a response indicating the operation was completed to the memory system controller.

At 340, a third command may be transmitted. For example, the memory system controller may transmit the third command to the first memory device based on receiving the data from the memory device (or after step 335). In some examples, the memory system controller may transmit the third command to initiate a second operation at the first memory device. The third command may indicate a type of command (e.g., program command indicated by "00h"), a column and row address (e.g., C & R Add), and additional information pertinent to the second command (e.g., "20h"). In some examples, the memory system controller may refrain from transmitting the third command to the second memory device. That is, because the second memory device drove the signal "00b" at the time 325, the memory system controller may determine the second memory device is not ready for service and drive the CE 1 signal high to ensure the second memory device is decoupled from the data bus and does not receive the third command.

At 350, a fourth command may be transmitted. For example, the memory system controller may transmit the fourth command to the first memory device based on initiating the second operation at the first memory device. The memory system controller may transmit the fourth command "77h" to resume the concurrent polling operation.

At 355, a status may be received. For example, a memory system controller may concurrently receive a status from each memory device. After sending the fourth command, the memory system controller may also transition the CE 1 signal from the high state back to the low state. That is, the memory system controller may couple the second memory device back to the data bus. As the second memory device was isolated from the data bus since time 325, the second memory device may drive a status (e.g., an indication of whether the second memory device is ready for service) based on the first command transmitted—e.g., based on the first "77h" command transmitted by the memory system controller. In some examples, while the memory system controller was servicing the first memory device (e.g., transmitting the second command, receiving the data, and transmitting the third and fourth command) the second memory device may have completed the initial operation. Accordingly, the second memory device may drive a signal "10b" to indicate the first section of the second memory device is ready for service. The memory system controller may then proceed to service the second memory device (e.g., repeat the steps 330-350 for the second memory device). By performing concurrent polling operations, the memory system controller may quickly identify which memory devices (or portions of the memory devices) are available to service, reducing times the memory devices are idly waiting to be serviced. This may reduce latency and the power consumption of the system.

Figure 4:
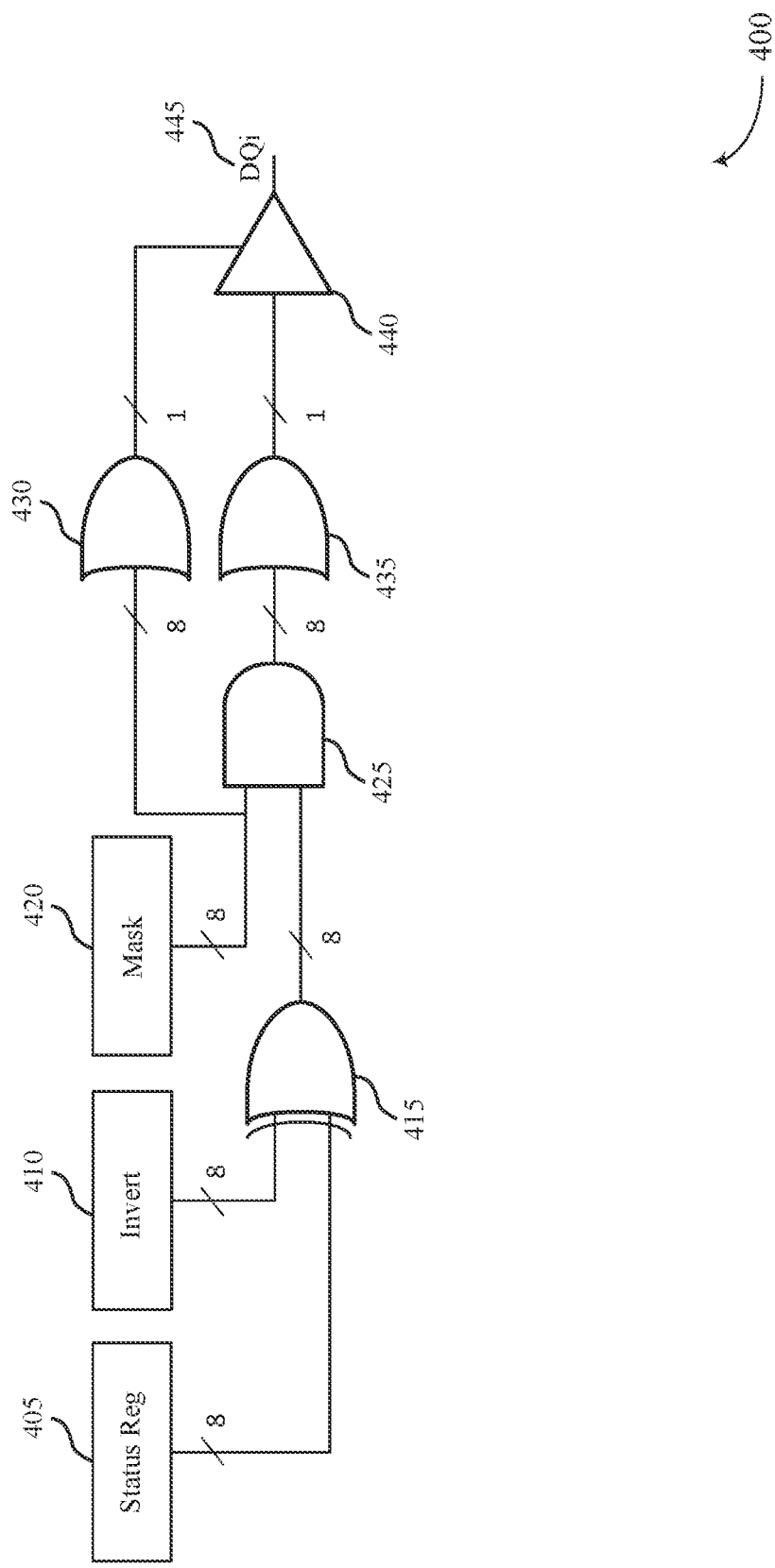
FIG. 4 illustrates an example of a circuit that supports reduced pin status register in accordance with examples as disclosed herein

FIG. 4 illustrates an example of a circuit 400 that supports reduced pin status register in accordance with examples as disclosed herein. The circuit 400 may be included in a memory device (e.g., memory device 230 as described with reference to FIG. 2) and output a status (e.g., status 245 as described with reference to FIG. 2) that indicates whether the memory device is ready for service. The circuit 400 may include a status register 405, an inversion register 410, and a mask register 420. The circuit 400 may further include an XOR gate 415, an AND gate 425, an OR gate 430, an OR gate 435, and a buffer 440. The circuit 400 may output a DQi 445.

In some examples, as described with reference to FIGS. 2 and 3, a memory device may output a status (e.g., DQi 445) concurrently with other memory devices on a data bus. In some examples, the memory device may output the status utilizing the circuit 400. That is, the memory device may utilize the circuit 400 to compress or mask multiple bits of the status register 405 into a single bit DQi 445 to communicate to a memory system controller (e.g., memory system controller 215 as described with reference to FIG. 2).

Status register 405 may be configured to store bits associated with information a status of the memory device. For example, the status register 405 may store bits that indicate if the memory device is ready for outputting data, ready for a new operation, is ready to be serviced, the cache is ready for service, the array is ready for service, if an error occurred during the operation, etc. In some examples, the status register 405 may include eight (8) bits.

Inversion register 410 may be configured to invert the state of the bits stored in the status register 405. In some examples, the inversion register 410 may be programmed by the memory controller to select if a bit in the status register 405 should be inverted. The inversion register may have a single bit value programmed that is replicated for each bit of the status register 405, or may have one bit for each bit of the status register 405 (e.g., the inversion state of each bit of the status register 405 may be independently controllable), in some cases.

The mask register 420 may store a set of bits configured to provide a bit mask for the bits stored in the status register 405. That is, the status register 405 may store eight (8) bits and the mask register 420 may be configured to extract the bits indicating whether the memory device is ready for service from the bits outputted by the status register 405 via the AND gate 425.

The XOR gate 415, AND gate 425, OR gate 435 may be configured to mask or compress the eight (8) bits into a single bit. It should be noted, the configuration of the XOR gate 415, AND gate 425, and OR gate 435 is one example of generating a bit from the eight (8) bits outputted from the status register 405 and other configuration may be utilized to generate the bit.

The OR gate 430 may be configured to output a bit to enable or disable buffer 440. That is, in response to a concurrent polling command (e.g., "77h") as described with reference to FIG. 3), the OR gate 430 may output a bit that activates the buffer 440 to enable the bit DQi 445 to be driven to a data bus (e.g., data bus 205 as described with reference to FIG. 2) based on the bits outputted from the mask register 420. That is, the output of the mask register 420 may also be configured to provide an input to the OR gate 430 to enable or disable the buffer 440.

The buffer 440 may be configured to output or prevent the output of the bit DQi 445. For example, the buffer 440 may output the bit DQi 445 and enable the memory device to drive a data line on the data bus with a status of an operation being performed by the memory device in response to a concurrent polling command. In other examples, the buffer 440 may be disabled and prevent the output bit DQi 445 from being driven onto the data line of the data bus—e.g., when the memory device may receive a low chip enable signal from the memory system controller. In some cases, the memory device may be configured to generate multiple output bits DQi 445—e.g., one for each independent word line or plane. In such examples, the memory device may be configured to generate the output DQi 445 from each independent word line on a different data line—e.g., the memory device may output two (2) DQi 445 bits, one on a first data line and one on a second data line.

It should be noted each memory device may include one or more circuits 400. This may enable each memory device to generate a DQi 445 bit at each DQ pin (e.g. data line of the data bus) or generate multiple DQI 445 bits for each independent section (e.g., for each independent word line or plane). Additionally or alternatively, circuit 400 is one example of generating a status bit. In other examples, the memory device may use a different circuit or configuration to generate the status bit. For example, the memory device may include less registers and route the result from the status register 405 with a multiplexer and a mask. In such examples, the masked bit from the multiplexer may be routed via an unselected high impedance (HI-Z) state DQ pin. Additionally or alternatively, circuit 400 may have additional registers. For example, circuit 400 may have a register that multiplexes output of OR gates 430 and 435 to different output bits (e.g., DQi 445 drivers). Thus, a memory system controller may use the register to set different memory devices to drive different output bits of the data bus (e.g., to dynamically determine the data lines of the data bus assigned to each of multiple memory devices for the concurrent status polling command).

Figure 5:
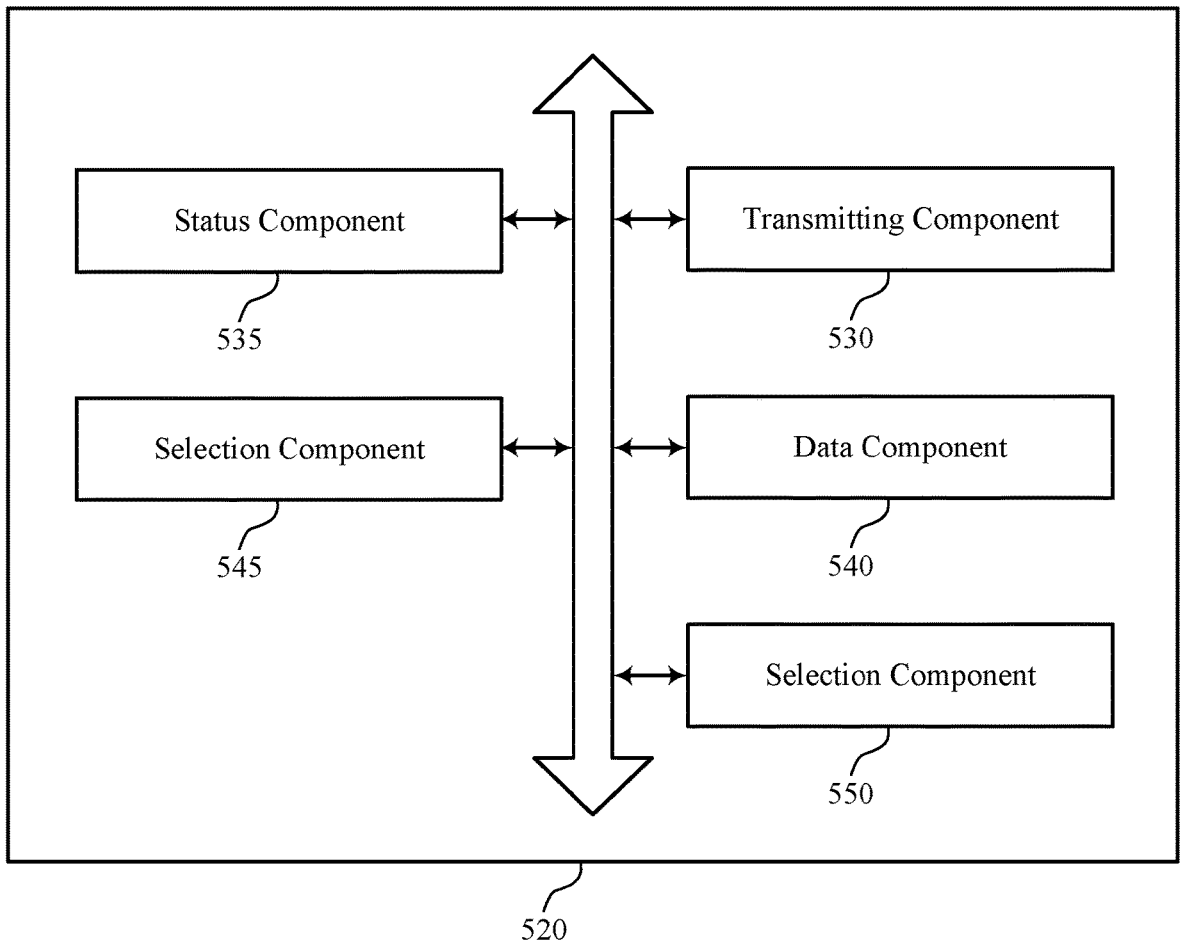
FIG. 5 shows a block diagram of a memory system that supports reduced pin status register in accordance with examples as disclosed herein.

FIG. 5 shows a block diagram 500 of a memory system 520 that supports reduced pin status register in accordance with examples as disclosed herein. The memory system 520 may be an example of aspects of a memory system as described with reference to FIGS. 1 through 4. The memory system 520, or various components thereof, may be an example of means for performing various aspects of reduced pin status register as described herein. For example, the memory system 520 may include a transmitting component 530, a status component 535, a data component 540, a selection component 545, a selection component 550, or any combination thereof. Each of these components may communicate, directly or indirectly, with one another (e.g., via one or more buses).

The transmitting component 530 may be configured as or otherwise support a means for transmitting a first command associated with a first operation to a first memory die. In some cases, the transmitting component 530 may be configured as or otherwise support a means for transmitting a second command associated with a second operation to a second memory die. In some instances, the transmitting component 530 may be configured as or otherwise support a means for transmitting a third command concurrently to the first memory die and the second memory die based at least in part on transmitting the first command and the second command, the third command requesting a first status of the first operation from the first memory die and a second status of the second operation from the second memory die.

In some examples, the transmitting component 530 may be configured as or otherwise support a means for transmitting a fifth command associated with a third operation to the second memory die based at least in part on receiving the data from the second memory die. In some cases, the transmitting component 530 may be configured as or otherwise support a means for transmitting a sixth command concurrently to the first memory die and the second memory die based at least in part on transmitting the fifth command, the sixth command requesting the first status of the first operation and a third status of the third operation.

In some instances, the transmitting component 530 may be configured as or otherwise support a means for transmitting a fourth command concurrently with the first command to the first memory die, where the first command is associated with a first portion of the first memory die and the fourth command is associated with a third operation on a second portion of the first memory die. In some examples, the status component 535 may be configured as or otherwise support a means for receiving, concurrently via the data bus, a third status of the third operation and the first status of the first operation based at least in part on transmitting the fourth command, and where the third command requests the third status of the third operation. In some cases, the transmitting component 530 may be configured as or otherwise support a means for transmitting a fourth command to the second memory die to select the second memory die to output data associated with the second operation onto the data bus.

The status component 535 may be configured as or otherwise support a means for receiving, concurrently via the data bus at a controller, the first status of the first operation from the first memory die and the second status of the second operation from the second memory die. In some examples, the status component 535 may be configured as or otherwise support a means for determining that the second memory die is awaiting service for the second operation based at least in part on receiving the second status concurrently with the first status.

In some cases, the status component 535 may be configured as or otherwise support a means for determining that the first memory die and the second memory die are executing the first operation and the second operation, respectively, based at least in part on receiving the first status concurrently with the second status. In some instances, the status component 535 may be configured as or otherwise support a means for refraining from transmitting a fourth command associated with a third operation to the first memory die or the second memory die based at least in part on determining the first memory die and the second memory die are executing the first operation and the second operation, respectively.

In some examples, the status component 535 may be configured as or otherwise support a means for receiving the first status on a first subset of lines of the data bus, where the first subset of lines is associated with the first memory die for output of status information for the apparatus. In some instances, the status component 535 may be configured as or otherwise support a means for receiving the second status on a second subset of lines of the data bus, where the second subset of lines is associated with the second memory die for output of status information for the apparatus.

In some cases, the status component 535 may be configured as or otherwise support a means for receiving the first status on a first line of a subset of lines associated with the first memory die and receive the third status on a second line of the subset of lines associated with the first memory die.

In some examples, the data component 540 may be configured as or otherwise support a means for receiving the data from the second memory die based at least in part on transmitting the fourth command.

In some instances, the selection component 545 may be configured as or otherwise support a means for selecting a first subset of lines on the data bus to receive the first status from the first memory die, where selecting the first subset of lines is based at least in part on selecting the first memory die for the first operation and the second memory die for the second operation. In some examples, the selection component 550 may be configured as or otherwise support a means for selecting a second subset of lines on the data bus to receive the second status from the second memory die, where selecting the second subset of lines is based on the selecting the first memory die for the first operation and the second memory die for the second operation.

Figure 6:
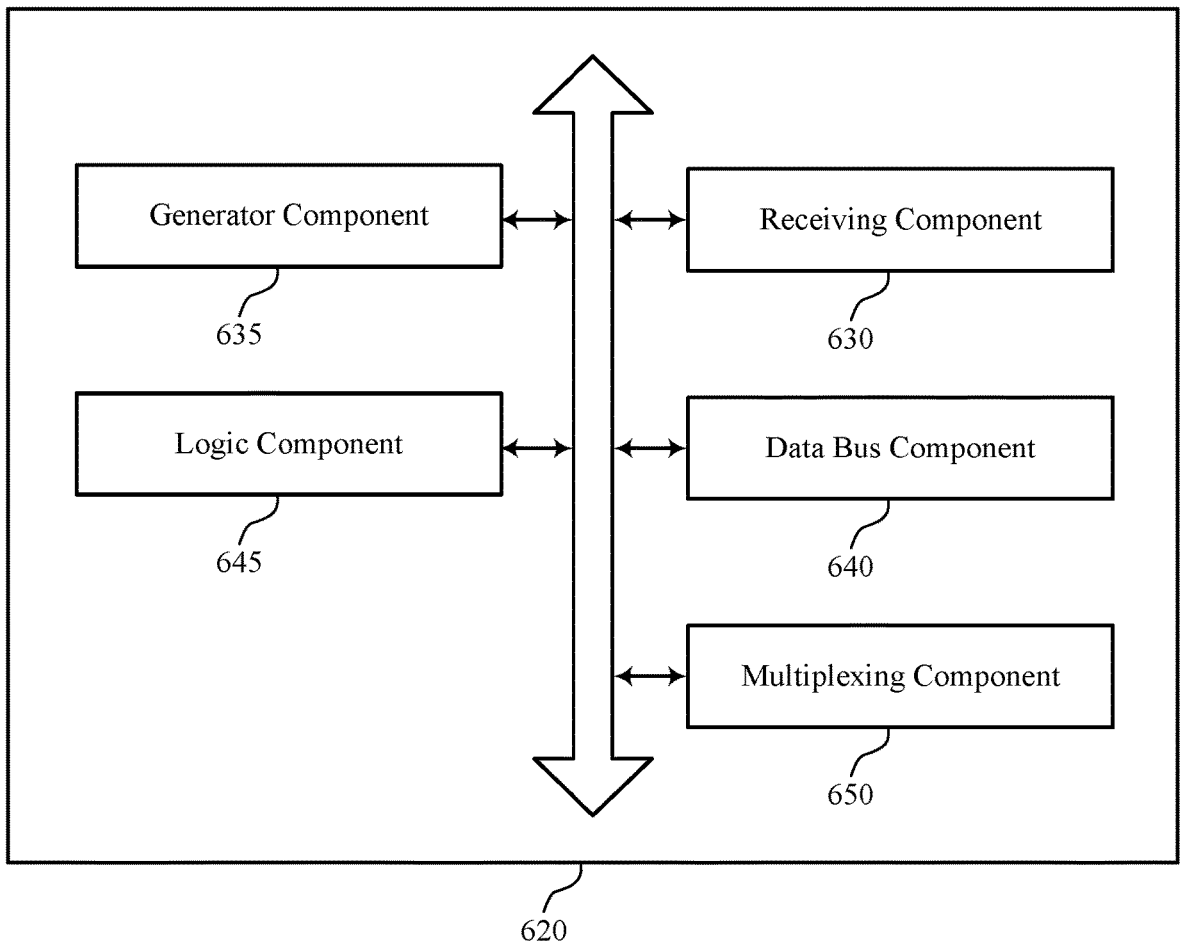
FIG. 6 shows a block diagram of a memory device that supports reduced pin status register in accordance with examples as disclosed herein.

FIG. 6 shows a block diagram 600 of a memory device 620 that supports reduced pin status register in accordance with examples as disclosed herein. The memory device 620 may be an example of aspects of a memory device as described with reference to FIGS. 1 through 4. The memory device 620, or various components thereof, may be an example of means for performing various aspects of reduced pin status register as described herein. For example, the memory device 620 may include a receiving component 630, a generator component 635, a data bus component 640, a logic component 645, a multiplexing component 650, or any combination thereof. Each of these components may communicate, directly or indirectly, with one another (e.g., via one or more buses).

The receiving component 630 may be configured as or otherwise support a means for receiving a first command associated with an operation on data stored at a memory including a plurality of memory cells. In some examples, the receiving component 630 may be configured as or otherwise support a means for receiving a second command requesting a status of the operation based at least in part on receiving the first command, where the second command is associated with a concurrent output of status operations on a data bus coupled with a plurality of devices, a device of the plurality of devices including the memory array and a controller coupled with the memory array.

In some examples, the bit outputted is associated with a request for service associated with the operation, and the receiving component 630 may be configured as or otherwise support a means for receiving a third command requesting the data associated with the operation.

In some instances, the receiving component 630 may be configured as or otherwise support a means for receiving a fourth command associated with a second operation based at least in part on outputting the data. In some cases, the receiving component 630 may be configured as or otherwise support a means for receiving a fifth command requesting a second status of the second operation based at least in part on receiving the fourth command, where the fifth command is associated with the concurrent output of status operations.

In some examples, the receiving component 630 may be configured as or otherwise support a means for receiving, at a multiplexer, a first set of bits associated with the status of the operation and information associated with the memory array.

In some cases, the receiving component 630 may be configured as or otherwise support a means for receiving an instruction, before receiving the first command, to utilize the first subset of lines of the data bus for outputting the status of the operation, where outputting the bit indicating the status of the operation onto the first subset of lines is based on the instruction received.

In some instances, the receiving component 630 may be configured as or otherwise support a means for receiving a third command, the first command associated with the operation on a first subset of memory cells of the plurality of memory cells coupled with a first word line, and the third command associated with a second operation on a second subset of memory cells of the plurality of memory cells coupled with a second word line.

The generator component 635 may be configured as or otherwise support a means for generating a bit indicating the status of the operation based at least in part on receiving the second command. In some examples, the generator component 635 may be configured as or otherwise support a means for generating a second bit indicating the second status of the second operation based at least in part on receiving the fifth command.

In some cases, the generator component 635 may be configured as or otherwise support a means for generating a second bit indicating a second status of the operation after the duration associated with the busy state of the operation.

In some instances, the data bus component 640 may be configured as or otherwise support a means for outputting the second bit onto the first subset of lines of the data bus based at least in part on generating the second bit.

In some cases, the data bus component 640 may associate the first subset of lines of the data bus with outputting the status of the operation at the memory array based at least in part on a one-time-programmable element.

The data bus component 640 may be configured as or otherwise support a means for outputting the bit onto a first subset of lines of the data bus based at least in part on generating the bit, where a second subset of lines of the data bus are associated with the concurrent output of status operations by a remaining plurality of devices. In some examples, the bit outputted is associated with a request for service associated with the operation, and the data bus component 640 may be configured as or otherwise support a means for outputting the data onto the first subset of lines of the data bus based at least in part on receiving the third command. In some instances, the data bus component 640 may be configured as or otherwise support a means for outputting the second bit onto the first subset of lines of the data bus based at least in part on generating the second bit.

In some cases, the data bus component 640 may be configured as or otherwise support a means for outputting the bit onto the first subset of lines for a duration associated with the busy state of the operation based at least in part on generating the bit.

In some instances, the data bus component 640 may be configured as or otherwise support a means for outputting the bit and a second bit indicating the status of the second operation concurrently on the first subset of lines of the data bus based at least in part on receiving the third command, where the second command requests a second status of the second operation.

In some cases, the data bus component 640 may associate the bit with a request for service for the operation and the second bit is associated with a busy state of the second operation.

In some instances, the data bus component 640 may be configured as or otherwise support a means for outputting a first set of bits from a first register associated with the status of the operation and information associated with the memory array. In some examples, the data bus component 640 may be configured as or otherwise support a means for outputting a second set of bits from a second register associated with an inversion state for the first set of bits.

In some examples, the logic component 645 may be configured as or otherwise support a means for generating, at a logic circuit, the bit based at least in part on the first set of bits and the second set of bits.

In some cases, the multiplexing component 650 may be configured as or otherwise support a means for multiplexing the first set of bits into the bit based at least in part on receiving the first set of bits, where generating the first set of bits is based at least in part on the multiplexing of the first set of bits, and where the bit is masked before outputting the bit onto the first subset of lines of the data bus.

Figure 7:
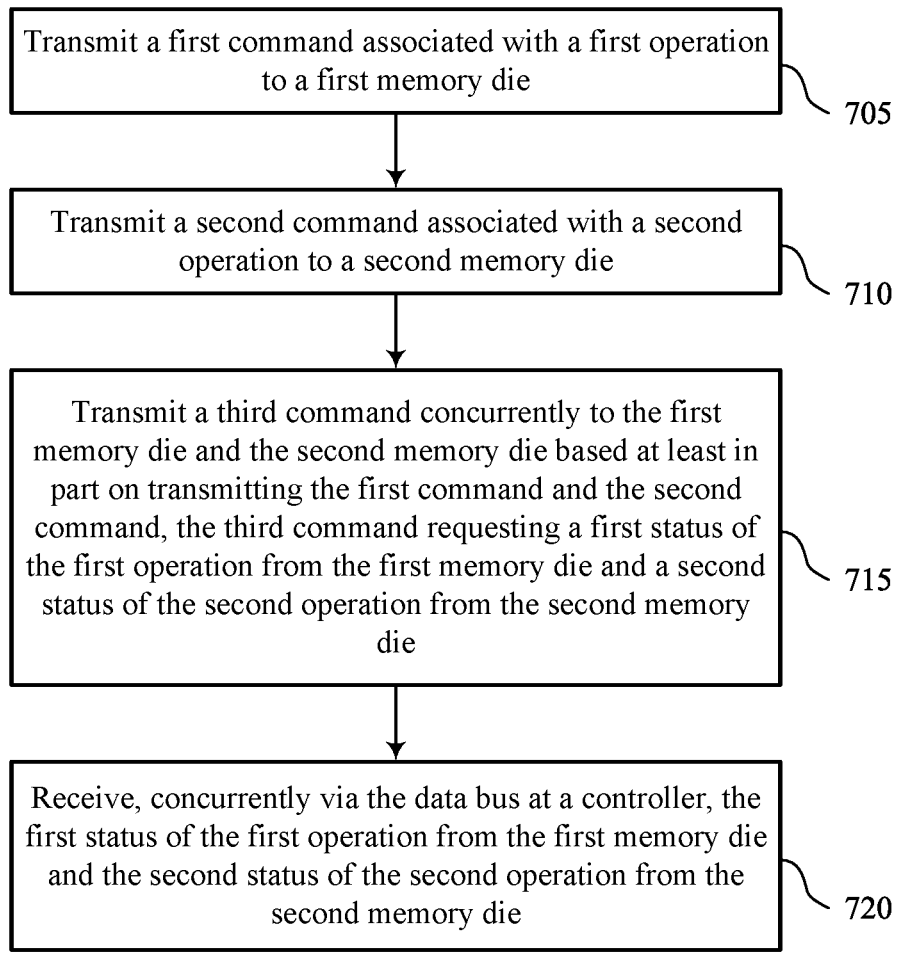
FIGS. 7 and 8 show flowcharts illustrating a method or methods that support reduced pin status register in accordance with examples as disclosed herein.

FIG. 7 shows a flowchart illustrating a method 700 that supports reduced pin status register in accordance with examples as disclosed herein. The operations of method 700 may be implemented by a memory system or its components as described herein. For example, the operations of method 700 may be performed by a memory system as described with reference to FIGS. 1 through 5. In some examples, a memory system may execute a set of instructions to control the functional elements of the device to perform the described functions. Additionally or alternatively, the memory system may perform aspects of the described functions using special-purpose hardware.

At 705, the method may include transmitting a first command associated with a first operation to a first memory die. The operations of 705 may be performed in accordance with examples as disclosed herein. In some examples, aspects of the operations of 705 may be performed by a transmitting component 530 as described with reference to FIG. 5.

At 710, the method may include transmitting a second command associated with a second operation to a second memory die. The operations of 710 may be performed in accordance with examples as disclosed herein. In some examples, aspects of the operations of 710 may be performed by a transmitting component 530 as described with reference to FIG. 5.

At 715, the method may include transmitting a third command concurrently to the first memory die and the second memory die based at least in part on transmitting the first command and the second command, the third command requesting a first status of the first operation from the first memory die and a second status of the second operation from the second memory die. The operations of 715 may be performed in accordance with examples as disclosed herein. In some examples, aspects of the operations of 715 may be performed by a transmitting component 530 as described with reference to FIG. 5.

At 720, the method may include receiving, concurrently via the data bus at a controller, the first status of the first operation from the first memory die and the second status of the second operation from the second memory die. The operations of 720 may be performed in accordance with examples as disclosed herein. In some examples, aspects of the operations of 720 may be performed by a status component 535 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for transmitting a first command associated with a first operation to a first memory die, transmitting a second command associated with a second operation to a second memory die, transmitting a third command concurrently to the first memory die and the second memory die based at least in part on transmitting the first command and the second command, the third command requesting a first status of the first operation from the first memory die and a second status of the second operation from the second memory die, and receiving, concurrently via the data bus at a controller, the first status of the first operation from the first memory die and the second status of the second operation from the second memory die.

Some cases of the method 700 and the apparatus described herein may further include operations, features, circuitry, logic, means, or instructions for determining that the second memory die may be awaiting service for the second operation based at least in part on receiving the second status concurrently with the first status, transmitting a fourth command to the second memory die to select the second memory die to output data associated with the second operation onto the data bus, and receiving the data from the second memory die based at least in part on transmitting the fourth command.

Some instances of the method 700 and the apparatus described herein may further include operations, features, circuitry, logic, means, or instructions for transmitting a fifth command associated with a third operation to the second memory die based at least in part on receiving the data from the second memory die.

Some examples of the method 700 and the apparatus described herein may further include operations, features, circuitry, logic, means, or instructions for transmitting a sixth command concurrently to the first memory die and the second memory die based at least in part on transmitting the fifth command, the sixth command requesting the first status of the first operation and a third status of the third operation.

Some cases of the method 700 and the apparatus described herein may further include operations, features, circuitry, logic, means, or instructions for determining that the first memory die and the second memory die may be executing the first operation and the second operation, respectively, based at least in part on receiving the first status concurrently with the second status and refraining from transmitting a fourth command associated with a third operation to the first memory die or the second memory die based at least in part on determining the first memory die and the second memory die may be executing the first operation and the second operation, respectively.

Some instances of the method 700 and the apparatus described herein may further include operations, features, circuitry, logic, means, or instructions for receiving the first status on a first subset of lines of the data bus, where the first subset of lines may be associated with the first memory die for output of status information for the apparatus and receiving the second status on a second subset of lines of the data bus, where the second subset of lines may be associated with the second memory die for output of status information for the apparatus.

Some examples of the method 700 and the apparatus described herein may further include operations, features, circuitry, logic, means, or instructions for selecting a first subset of lines on the data bus to receive the first status from the first memory die, where selecting the first subset of lines may be based at least in part on selecting the first memory die for the first operation and the second memory die for the second operation and selecting a second subset of lines on the data bus to receive the second status from the second memory die, where selecting the second subset of lines may be based on the selecting the first memory die for the first operation and the second memory die for the second operation.

Some cases of the method 700 and the apparatus described herein may further include operations, features, circuitry, logic, means, or instructions for transmitting a fourth command concurrently with the first command to the first memory die, where the first command may be associated with a first portion of the first memory die and the fourth command may be associated with a third operation on a second portion of the first memory die and receiving, concurrently via the data bus, a third status of the third operation and the first status of the first operation based at least in part on transmitting the fourth command, and where the third command requests the third status of the third operation.

Some instances of the method 700 and the apparatus described herein may further include operations, features, circuitry, logic, means, or instructions for receiving the first status on a first line of a subset of lines associated with the first memory die and receive the third status on a second line of the subset of lines associated with the first memory die.

Figure 8:
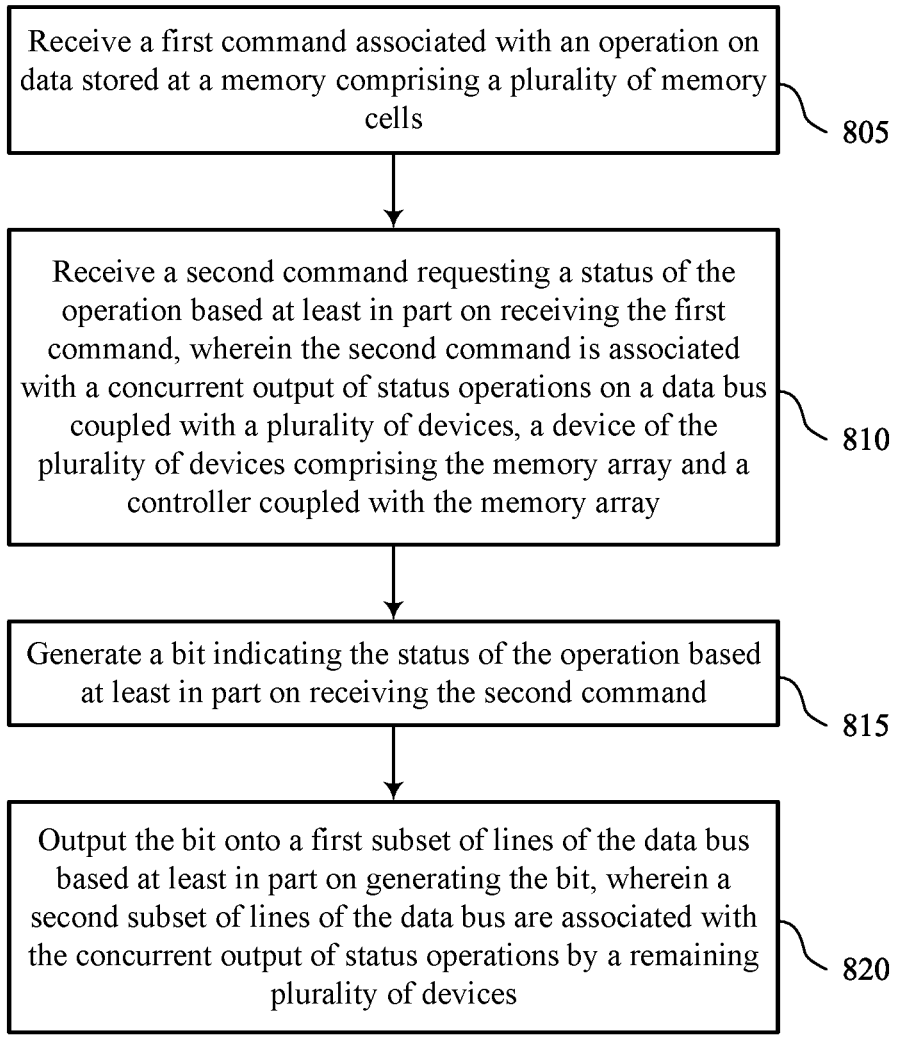

FIG. 8 shows a flowchart illustrating a method 800 that supports reduced pin status register in accordance with examples as disclosed herein. The operations of method 800 may be implemented by a memory device or its components as described herein. For example, the operations of method 800 may be performed by a memory device as described with reference to FIGS. 1 through 4 and 6. In some examples, a memory device may execute a set of instructions to control the functional elements of the device to perform the described functions. Additionally or alternatively, the memory device may perform aspects of the described functions using special-purpose hardware.

At 805, the method may include receiving a first command associated with an operation on data stored at a memory including a plurality of memory cells. The operations of 805 may be performed in accordance with examples as disclosed herein. In some examples, aspects of the operations of 805 may be performed by a receiving component 630 as described with reference to FIG. 6.

At 810, the method may include receiving a second command requesting a status of the operation based at least in part on receiving the first command, where the second command is associated with a concurrent output of status operations on a data bus coupled with a plurality of devices, a device of the plurality of devices including the memory array and a controller coupled with the memory array. The operations of 810 may be performed in accordance with examples as disclosed herein. In some examples, aspects of the operations of 810 may be performed by a receiving component 630 as described with reference to FIG. 6.

At 815, the method may include generating a bit indicating the status of the operation based at least in part on receiving the second command. The operations of 815 may be performed in accordance with examples as disclosed herein. In some examples, aspects of the operations of 815 may be performed by a generator component 635 as described with reference to FIG. 6.

At 820, the method may include outputting the bit onto a first subset of lines of the data bus based at least in part on generating the bit, where a second subset of lines of the data bus are associated with the concurrent output of status operations by a remaining plurality of devices. The operations of 820 may be performed in accordance with examples as disclosed herein. In some examples, aspects of the operations of 820 may be performed by a data bus component 640 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving a first command associated with an operation on data stored at a memory including a plurality of memory cells, receiving a second command requesting a status of the operation based at least in part on receiving the first command, where the second command is associated with a concurrent output of status operations on a data bus coupled with a plurality of devices, a device of the plurality of devices including the memory array and a controller coupled with the memory array, generating a bit indicating the status of the operation based at least in part on receiving the second command, and outputting the bit onto a first subset of lines of the data bus based at least in part on generating the bit, where a second subset of lines of the data bus are associated with the concurrent output of status operations by a remaining plurality of devices.

In some instances of the method 800 and the apparatus described herein, the bit outputted may be associated with a request for service associated with the operation and the method, apparatuses, and non-transitory computer-readable medium may include further operations, features, circuitry, logic, means, or instructions for receiving a third command requesting the data associated with the operation and outputting the data onto the first subset of lines of the data bus based at least in part on receiving the third command.

Some cases of the method 800 and the apparatus described herein may further include operations, features, circuitry, logic, means, or instructions for receiving a fourth command associated with a second operation based at least in part on outputting the data, receiving a fifth command requesting a second status of the second operation based at least in part on receiving the fourth command, where the fifth command may be associated with the concurrent output of status operations, generating a second bit indicating the second status of the second operation based at least in part on receiving the fifth command, and outputting the second bit onto the first subset of lines of the data bus based at least in part on generating the second bit.

In some examples of the method 800 and the apparatus described herein, and the method, apparatuses, and non-transitory computer-readable medium may include further operations, features, circuitry, logic, means, or instructions for outputting the bit onto the first subset of lines for a duration associated with the busy state of the operation based at least in part on generating the bit, generating a second bit indicating a second status of the operation after the duration associated with the busy state of the operation, and outputting the second bit onto the first subset of lines of the data bus based at least in part on generating the second bit.

In some cases of the method 800 and the apparatus described herein, the first subset of lines of the data bus may be associated with outputting the status of the operation at the memory array based at least in part on a one-time-programmable element.

Some instances of the method 800 and the apparatus described herein may further include operations, features, circuitry, logic, means, or instructions for receiving an instruction, before receiving the first command, to utilize the first subset of lines of the data bus for outputting the status of the operation, where outputting the bit indicating the status of the operation onto the first subset of lines may be based on the instruction received.

Some examples of the method 800 and the apparatus described herein may further include operations, features, circuitry, logic, means, or instructions for receiving a third command, the first command associated with the operation on a first subset of memory cells of the plurality of memory cells coupled with a first word line, and the third command associated with a second operation on a second subset of memory cells of the plurality of memory cells coupled with a second word line and outputting the bit and a second bit indicating the status of the second operation concurrently on the first subset of lines of the data bus based at least in part on receiving the third command, where the second command requests a second status of the second operation.

In some cases of the method 800 and the apparatus described herein, the bit may be associated with a request for service for the operation and the second bit may be associated with a busy state of the second operation.

Some instances of the method 800 and the apparatus described herein may further include operations, features, circuitry, logic, means, or instructions for outputting a first set of bits from a first register associated with the status of the operation and information associated with the memory array, outputting a second set of bits from a second register associated with an inversion state for the first set of bits, and generating, at a logic circuit, the bit based at least in part on the first set of bits and the second set of bits.

Some examples of the method 800 and the apparatus described herein may further include operations, features, circuitry, logic, means, or instructions for receiving, at a multiplexer, a first set of bits associated with the status of the operation and information associated with the memory array and multiplexing the first set of bits into the bit based at least in part on receiving the first set of bits, where generating the first set of bits may be based at least in part on the multiplexing of the first set of bits, and where the bit may be masked before outputting the bit onto the first subset of lines of the data bus.

It should be noted that the methods described above describe possible implementations, and that the operations and the steps may be rearranged or otherwise modified and that other implementations are possible. Further, portions from two or more of the methods may be combined.

An apparatus is described. The apparatus may include a first memory die coupled with a data bus, a second memory die coupled with the data bus, and a controller coupled with the first memory die and the second memory die via the data bus, the controller configured to transmit a first command associated with a first operation to the first memory die, transmit a second command associated with a second operation to the second memory die, transmit a third command concurrently to the first memory die and the second memory die based at least in part on transmitting the first command and the second command, the third command requesting a first status of the first operation and a second status of the second operation, and receive, concurrently via the data bus, the first status of the first operation from the first memory die and the second status of the second operation from the second memory die In some examples, the controller may further determine that the second memory die may be awaiting service for the second operation based at least in part on receiving the second status concurrently with the first status, transmit a fourth command to the second memory die to select the second memory die to output data associated with the second operation onto the data bus, and receive the data from the second memory die based at least in part on transmitting the fourth command.

In some instances, the controller may further transmit a fifth command associated with a third operation to the second memory die based at least in part on receiving the data from the second memory die.

In some cases, the controller may further transmit a sixth command concurrently to the first memory die and the second memory die based at least in part on transmitting the fifth command, the sixth command requesting the first status of the first operation and a third status of the third operation.

In some examples, the controller may further determine that the first memory die and the second memory die may be executing the first operation and the second operation, respectively, based at least in part on receiving the first status concurrently with the second status and refrain from transmitting a fourth command associated with a third operation to the first memory die or the second memory die based at least in part on determining the first memory die and the second memory die may be executing the first operation and the second operation, respectively.

In some instances, the controller may further receive the first status on a first subset of lines of the data bus, where the first subset of lines may be associated with the first memory die for output of status information for the apparatus and receive the second status on a second subset of lines of the data bus, where the second subset of lines may be associated with the second memory die for output of status information for the apparatus.

In some cases, the controller may further select a first subset of lines on the data bus to receive the first status from the first memory die, where the controller may be configured to select the first subset of lines based at least in part on selecting the first memory die for the first operation and the second memory die for the second operation and select a second subset of lines on the data bus to receive the second status from the second memory die, where the controller may be configured to select the second subset of lines based on the selecting the first memory die for the first operation and the second memory die for the second operation.

In some examples, the controller may further transmit a fourth command concurrently with the first command to the first memory die, where the first command may be associated with a first portion of the first memory die and the fourth command may be associated with a third operation on a second portion of the first memory die and receive, concurrently via the data bus, a third status of the third operation and the first status of the first operation based at least in part on transmitting the fourth command, and where the third command requests the third status of the third operation.

In some instances, the controller may further receive the first status on a first line of a subset of lines associated with the first memory die and receive the third status on a second line of the subset of lines associated with the first memory die.

In some cases, the apparatus may include a quantity of memory devices coupled with the data bus, where the quantity of memory devices coupled with the data bus may be based at least in part on a quantity of data pins for the controller, and where the controller may be configured to receive a concurrent status from each memory device of the quantity of memory devices.

Another apparatus is described. The apparatus may include a memory array including a plurality of memory cells storing data and a controller coupled with the memory array and configured to receive a first command associated with an operation on the data, receive a second command requesting a status of the operation based at least in part on receiving the first command, where the second command is associated with a concurrent output of status operations on a data bus coupled with a plurality of devices, a device of the plurality of devices including the memory array and the controller, generate a bit indicating the status of the operation based at least in part on receiving the second command, and output the bit onto a first subset of lines of the data bus based at least in part on generating the bit, where a second subset of lines of the data bus are associated with the concurrent output of status operations by a remaining plurality of devices In some examples, the controller may further receive a third command requesting the data associated with the operation and output the data onto the first subset of lines of the data bus based at least in part on receiving the third command.

In some instances, the controller may further receive a fourth command associated with a second operation based at least in part on outputting the data, receive a fifth command requesting a second status of the second operation based at least in part on receiving the fourth command, where the fifth command may be associated with the concurrent output of status operations, generate a second bit indicating the second status of the second operation based at least in part on receiving the fifth command, and output the second bit onto the first subset of lines of the data bus based at least in part on generating the second bit.

In some cases, the controller may further output the bit onto the first subset of lines for a duration associated with the busy state of the operation based at least in part on generating the bit, generate a second bit indicating a second status of the operation after the duration associated with the busy state of the operation, and output the second bit onto the first subset of lines of the data bus based at least in part on generating the second bit.

In some instances of the apparatus, the first subset of lines of the data bus may be associated with outputting the status of the operation at the memory array based at least in part on a one-time-programmable element.

In some cases, the controller may further receive an instruction, before receiving the first command, to utilize the first subset of lines of the data bus for outputting the status of the operation, where the controller may be configured to output the bit indicating the status of the operation onto the first subset of lines based on the instruction received.

In some examples, the controller may further receive a third command, the first command associated with the operation on a first subset of memory cells of the plurality of memory cells coupled with a first word line, and the third command associated with a second operation on a second subset of memory cells of the plurality of memory cells coupled with a second word line and output the bit and a second bit indicating the status of the second operation concurrently on the first subset of lines of the data bus based at least in part on receiving the third command, where the second command requests a second status of the second operation.

In some instances of the apparatus, the bit may be associated with a request for service for the operation and the second bit may be associated with a busy state of the second operation.

In some cases, the apparatus may include a first register including a first set of bits associated with the status of the operation and information associated with the memory array, a second register including a second set of bits controlling an inversion state for the first set of bits, and a logic circuit configured to utilize the first set of bits and the second set of bits to generate the bit, where the controller may be configured to generate the bit based at least in part on the first register, the second register, and the logic circuit.

In some examples, the apparatus may include a multiplexer coupled with the controller and configured to receive a first set of bits associated with the status of the operation and information associated with the memory array and multiplex the first set of bits into the bit based at least in part on receiving the first set of bits, wherein the controller is configured to generate the first set of bits based at least in part on the multiplexing of the first set of bits, and wherein the controller is configured to mask the bit before outputting the bit onto the first subset of lines of the data bus Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," "based at least in part on," and "in response to," may be used interchangeably. In some examples, if the terms "if," "when," "based on," "based at least in part on," and "in response to," are used to describe a conditional action or connection between portions of a process, the terms may be interchangeable. In some examples, if used to describe a conditional action or process, the terms "if," "when," "based on," "based at least in part on," and "in response to" may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
 a first memory die coupled with a data bus;
 a second memory die coupled with the data bus; and
 a memory system controller coupled with the first memory die and the second memory die via the data bus, the memory system controller configured to:
  transmit a first command concurrently to the first memory die and the second memory die, the first command requesting a first status of a first operation associated with the first memory die and a second status of a second operation associated with the second memory die; and
  receive, concurrently via the data bus, the first status of the first operation from the first memory die and the second status of the second operation from the second memory die.

2. The apparatus of claim 1, wherein the memory system controller is further configured to:
 determine that the second memory die is awaiting service for the second operation based at least in part on receiving the second status concurrently with the first status;
 transmit a second command to the second memory die to select the second memory die to output data associated with the second operation onto the data bus; and
 receive the data from the second memory die based at least in part on transmitting the second command.

3. The apparatus of claim 2, wherein the memory system controller is further configured to:
 transmit a third command associated with a third operation to the second memory die based at least in part on receiving the data from the second memory die.

4. The apparatus of claim 3, wherein the memory system controller is further configured to:
 transmit a fourth command concurrently to the first memory die and the second memory die based at least in part on transmitting the third command, the fourth command requesting the first status of the first operation and a third status of the third operation.

5. The apparatus of claim 1, wherein the memory system controller is further configured to:
 determine that the first memory die and the second memory die are executing the first operation and the second operation, respectively, based at least in part on receiving the first status concurrently with the second status; and
 refrain from transmitting a second command associated with a third operation to the first memory die or the second memory die based at least in part on determining the first memory die and the second memory die are executing the first operation and the second operation, respectively.

6. The apparatus of claim 1, wherein the memory system controller is further configured to:
 receive the first status on a first subset of lines of the data bus, wherein the first subset of lines is associated with the first memory die for output of status information for the apparatus; and
 receive the second status on a second subset of lines of the data bus, wherein the second subset of lines is associated with the second memory die for output of status information for the apparatus.

7. The apparatus of claim 1, wherein the memory system controller is further configured to:
 select a first subset of lines on the data bus to receive the first status from the first memory die, wherein the memory system controller is configured to select the first subset of lines based at least in part on selecting the first memory die for the first operation and the second memory die for the second operation; and
 select a second subset of lines on the data bus to receive the second status from the second memory die, wherein the memory system controller is configured to select the second subset of lines based on the selecting the first memory die for the first operation and the second memory die for the second operation.

8. The apparatus of claim 1, wherein the memory system controller is further configured to:
 transmit a second command concurrently with a third command to the first memory die, wherein the third command is associated with a first portion of the first memory die and the second command is associated with a third operation on a second portion of the first memory die; and
 receive, concurrently via the data bus, a third status of the third operation and the first status of the first operation based at least in part on transmitting the second command, and wherein the first command requests the third status of the third operation.

9. The apparatus of claim 8, wherein the memory system controller is further configured to:
 receive the first status on a first line of a subset of lines associated with the first memory die and receive the third status on a second line of the subset of lines associated with the first memory die.

10. The apparatus of claim 1, further comprising:
 a quantity of memory devices coupled with the data bus, wherein the quantity of memory devices coupled with the data bus is based at least in part on a quantity of data pins for the memory system controller, and wherein the memory system controller is configured to receive a concurrent status from each memory device of the quantity of memory devices.

11. An apparatus, comprising:
 a memory array comprising a plurality of memory cells storing data; and
 a local controller coupled with the memory array and configured to:
  receive a first command requesting a status of an operation on the data, wherein the first command is associated with a concurrent output of status operations on a data bus coupled with a plurality of devices, a device of the plurality of devices comprising the apparatus;
  generate a bit indicating the status of the operation based at least in part on receiving the first command; and
  output the bit onto a first subset of lines of the data bus based at least in part on generating the bit, wherein a second subset of lines of the data bus are associated with the concurrent output of status operations by a remaining plurality of devices.

12. The apparatus of claim 11, wherein the bit outputted is associated with a request for service associated with the operation, and wherein the local controller is further configured to:
 receive a second command requesting the data associated with the operation; and
 output the data onto the first subset of lines of the data bus based at least in part on receiving the second command.

13. The apparatus of claim 12, wherein the local controller is further configured to:
receive a third command associated with a second operation based at least in part on outputting the data;
receive a fourth command requesting a second status of the second operation based at least in part on receiving the third command, wherein the fourth command is associated with the concurrent output of status operations;
generate a second bit indicating the second status of the second operation based at least in part on receiving the fourth command; and
output the second bit onto the first subset of lines of the data bus based at least in part on generating the second bit.

14. The apparatus of claim 11, wherein the bit outputted is associated with a busy state of the operation and wherein the local controller is further configured to:
output the bit onto the first subset of lines for a duration associated with the busy state of the operation based at least in part on generating the bit;
generate a second bit indicating a second status of the operation after the duration associated with the busy state of the operation; and
output the second bit onto the first subset of lines of the data bus based at least in part on generating the second bit.

15. The apparatus of claim 11, wherein the first subset of lines of the data bus are associated with outputting the status of the operation at the memory array based at least in part on a one-time-programmable element.

16. The apparatus of claim 11, wherein the local controller is further configured to:
receive an instruction, before receiving the first command, to utilize the first subset of lines of the data bus for outputting the status of the operation, wherein the local controller is configured to output the bit indicating the status of the operation onto the first subset of lines based on the instruction received.

17. The apparatus of claim 11, wherein the local controller is further configured to:
receive a second command and a third command, the second command associated with the operation on a first subset of memory cells of the plurality of memory cells coupled with a first word line, and the third command associated with a second operation on a second subset of memory cells of the plurality of memory cells coupled with a second word line; and
output the bit and a second bit indicating the status of the second operation concurrently on the first subset of lines of the data bus based at least in part on receiving the second command and the third command, wherein the third command requests a second status of the second operation.

18. The apparatus of claim 17, wherein the bit is associated with a request for service for the operation and the second bit is associated with a busy state of the second operation.

19. The apparatus of claim 11, further comprising:
a first register comprising a first set of bits associated with the status of the operation and information associated with the memory array;
a second register comprising a second set of bits controlling an inversion state for the first set of bits; and
a logic circuit configured to utilize the first set of bits and the second set of bits to generate the bit, wherein the local controller is configured to generate the bit based at least in part on the first register, the second register, and the logic circuit.

20. A method, comprising:
transmitting a first command concurrently to a first memory die and a second memory die, the first command requesting a first status of a first operation associated with the first memory die and a second status of a second operation associated with the second memory die, the first memory die and the second memory die coupled with a data bus; and
receive, concurrently via the data bus, the first status of the first operation from the first memory die and the second status of the second operation from the second memory die.

* * * * *